United States Patent
Yasui

(10) Patent No.: US 8,068,044 B2
(45) Date of Patent: Nov. 29, 2011

(54) CORRECTION CIRCUIT FOR D/A CONVERTER

(75) Inventor: Shoji Yasui, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/660,605

(22) Filed: Mar. 2, 2010

(65) Prior Publication Data

US 2010/0225510 A1 Sep. 9, 2010

(30) Foreign Application Priority Data

Mar. 5, 2009 (JP) .................. 2009-051545

(51) Int. Cl.
*H03M 1/06* (2006.01)
(52) U.S. Cl. ......... 341/118; 341/119; 341/120; 341/144
(58) Field of Classification Search .......... 341/117–120, 341/144
See application file for complete search history.

(56) References Cited

U.S. PATENT DOCUMENTS 6,118,262 A * 9/2000 Suzuki ........................ 323/313
2008/0224773 A1 9/2008 Tsuji et al.

FOREIGN PATENT DOCUMENTS

JP 2008236010 10/2008

OTHER PUBLICATIONS

Korean Intellectual Property Office "Notice of Submission of Argument" dated Jun. 13, 2011, Application Serial No. 10-2010-0017833 of Yamaha Corporation, 3 pages.

* cited by examiner

*Primary Examiner* — Jean Jeanglaude
(74) *Attorney, Agent, or Firm* — Pillsbury Winthrop Shaw Pittman LLP

(57) ABSTRACT

There is provided a correction circuit for a D/A converter, comprising: a constant current source to be connected between high- and low-potential power source lines for supplying a power source voltage to the D/A converter; and a current controller which is adapted to control a current flowing to the constant current source in accordance with an input digital signal to the D/A converter, so as to reduce a variation of a sum of currents which, when the input digital signal to the D/A converter is changed, flows to the low-potential power source line from the high-potential power source line through the D/A converter and the constant current source, respectively.

7 Claims, 3 Drawing Sheets

US 8,068,044 B2

CORRECTION CIRCUIT FOR D/A CONVERTER

BACKGROUND OF THE INVENTION

1. Technical Field

The present invention relates to a correction circuit which corrects nonlinear distortion caused in the input/output characteristics for a D/A converter.

2. Background Art

FIG. 4 is a circuit diagram showing the configuration of a conventional voltage addition-type D/A converter 10. As shown in FIG. 4, the voltage addition-type D/A converter 10 is configured by a voltage generator 11 which generates voltages respectively corresponding to the values of bits D0 to D7 of an input digital signal, and a voltage adding unit 12 which generates an output signal OUT that is obtained by adding the voltages generated by the voltage generator 11. In the illustrated example, the voltage generator 11 is configured by eight inverters N0 to N7, the outputs of which are produced by level-inverting the bits D0 to D7 of the input digital signal. In the voltage adding unit 12, one ends of resistors Ri0 to Ri7 are connected to output ends of the inverters N0 to N7, respectively, and the other ends are commonly connected to one end of a resistor R1. In the example, the resistors Ri0 to Ri7 have the same resistance 12R which is sufficiently lower than that of the resistor R1, and the output resistances of the inverters N0 to N7 are sufficiently lower than those of the resistors Ri0 to Ri7. The other end of the resistor R1 is connected to an inverting input terminal (minus input terminal) of an operational amplifier 13, and a non-inverting input terminal (plus input terminal) is fixed to a reference level Vref. In the case where the power source voltage of the voltage addition-type D/A converter 10 is VCC, for example, the reference level Vref is VCC/2. A resistor R2 is connected between the output end of the operational amplifier 13 and the inverting input terminal, and the output signal of the operational amplifier 13 is the output signal OUT of the voltage addition-type D/A converter 10.

When the number of H-level bits among the bits D0 to D7 of the input digital signal is n, one ends of the n number of resistors among the eight resistors Ri0 to Ri7 are made L level (0 V), and those of the (8−n) number of resistors are made H level (VCC) by the inverters N0 to N7. In a situation where the resistance of the resistor R1 is sufficiently higher than the resistance of the resistors Ri0 to Ri7, little current flows through the resistor R1. Therefore, in a situation where the bits D0 to D3 are at L level, the one ends of the resistors Ri0 to Ri3 are connected to the power source VCC, the bits D4 to D7 are at H level, and the one ends of the resistors Ri4 to Ri7 are grounded (the state of n=4), for example, the currents which flow from the power source VCC to the four parallel connected resistors Ri0 to Ri3 flow as they are through the four parallel connected resistors Ri4 to Ri7. Therefore, the voltage V1 of the common junctions of the resistors Ri0 to Ri7 and the resistor R1 is proportional to the number n of H-level bits among the bits D0 to D7 as indicated by the following expression:

$$V1 = VCC\{12R/(8-n)\}/\{(12R/(8-n)) + (12R/n)\} \quad (1)$$

$$= VCC \cdot n/8$$

The voltage V1 is multiplied by a factor of −R2/R1 by a multiplier configured by the resistors R1, R2 and the operational amplifier 13, and set as the output signal OUT. As described above, according to the voltage addition-type D/A converter 10, the output signal OUT, the voltage of which is proportional to the number n of H-level bits among the bits D0 to D7 of the input digital signal, and can express nine scales. A voltage addition-type D/A converter of this kind is disclosed in, for example, FIG. 5 of JP-2008-236010A.

In the above-described conventional voltage addition-type D/A converter 10, high- and low-potential power source lines 15, 16 which supply the power source voltage VCC to the voltage addition-type D/A converter 10 have wiring resistances Rp, Rn, respectively. In the conventional voltage addition-type D/A converter 10, depending on the contents of the bits D0 to D7 of the input digital signal, currents flowing through the wiring resistances Rp, Rn are different from each other. This will be specifically described below.

First, FIGS. 5A to 5C show equivalent circuits of the input side of the resistor R1 in FIG. 4 in the case where the values of the bits of the input digital signal are variously changed. In FIG. 5A, all of the bits D0 to D7 of the input digital signal are at L level, and, in FIG. 5B, all of the bits D0 to D7 of the input digital signal are at H level. In these cases, the resistors Ri0 to Ri7 are connected between the wiring resistance Rp on the side of the power source VCC and the resistor R1 or the wiring resistance Rn on the side of the ground and the resistor R1. Therefore, no current flows through the resistors Ri0 to Ri7, and no current flows also through the wiring resistances Rp, Rn. By contrast, in the case where, as shown in FIG. 5C, the bits D0 to D3 are at L level, and the bits D4 to D7 are at H level, a parallel connection of the four resistors Ri0 to Ri3 (the resistance 12R/4=3R) is connected between the wiring resistance Rp on the side of the power source VCC and the resistor R1, and that of the four resistors Ri4 to Ri7 (the resistance 12R/4=3R) is connected between the wiring resistance Rn on the side of the ground and the resistor R1. Therefore, a current of VCC/(6R) flows through the wiring resistances Rp, Rn.

Although the illustration is omitted, in the case where the number n of H-level bits among the bits D0 to D7 is other than 4, the current I flowing through the wiring resistances Rp, Rn is changed depending on the number n. Specifically, the relationships among the number n, the resistance Ra of the resistor between the wiring resistance Rp and the resistor R1, the resistance Rb of the resistor between the wiring resistance Rn and the resistor R1, and the current I flowing through the wiring resistances Rp, Rn are as listed below.

TABLE 1

| n | Ra | Rb | I |
|---|------|------|------------|
| 0 | 3R/2 | ∞ | 0 |
| 1 | 12R/7 | 12R | (7VCC)/(96R) |
| 2 | 2R | 6R | VCC/(8R) |
| 3 | 12R/5 | 4R | (5VCC)/(32R) |
| 4 | 3R | 3R | VCC/(6R) |
| 5 | 4R | 12R/5 | (5VCC)/(32R) |
| 6 | 6R | 2R | VCC/(8R) |
| 7 | 12R | 12R/7 | (7VCC)/(96R) |
| 8 | ∞ | 3R/2 | 0 |

As described above, in the conventional voltage addition-type D/A converter 10, the current I flowing through the wiring resistance Rp of the high-potential power source line 15 and the wiring resistance Rn of the low-potential power source line 16 is changed depending on the contents of the bits D0 to D7 of the input digital signal, and hence the power source voltage which is applied to the voltage generator 11 through the high- and low-potential power source lines 15, 16 is changed depending on the contents of the bits D0 to D7 of the input digital signal. In the conventional voltage addition-type D/A converter 10, in the case where the wiring resistance Rp of the high-potential power source line 15 and the wiring resistance Rn of the low-potential power source line 16 are high, therefore, there is a problem in that the linearity of the output signal OUT with respect to the input digital signal is degraded.

SUMMARY OF THE INVENTION

The invention has been conducted in view of the above-described circumstances. It is an object of the invention to provide a correction circuit which can improve degradation of the linearity of a D/A converter caused by a voltage drop of the wiring resistance of a power source line.

An aspect of the present invention provides a correction circuit for a D/A converter, including: a constant current source to be connected between high- and low-potential power source lines for supplying a power source voltage to the D/A converter; and a current controller which is adapted to control a current flowing to the constant current source in accordance with an input digital signal to the D/A converter, so as to reduce a variation of a sum of currents which, when the input digital signal to the D/A converter is changed, flows to the low-potential power source line from the high-potential power source line through the D/A converter and the constant current source, respectively.

In the correction circuit, the current controller may control the current flowing to the constant current source so that the sum of currents which flows to the low-potential power source becomes constant.

In the correction circuit, the current controller may control the current flowing to the constant current source so that the sum of currents which flows to the low-potential power source becomes the same as a current which flows through the D/A converter in a specific number of high-level bits of the input digital signal.

Another aspect of the present invention provides a combination circuit, including: a D/A converter; and a correction circuit including: a constant current source connected between high- and low-potential power source lines for supplying a power source voltage to the D/A converter; and a current controller which is adapted to control a current flowing to the constant current source in accordance with an input digital signal to the D/A converter.

According to the invention, variations of voltage drops which are produced in the wiring resistances of the high- and low-potential power source lines depending on the input digital signal are reduced, and variations of the power source voltage between the high- and low-potential power source lines can be reduced, whereby the linearity of the D/A converter can be improved.

DETAILED DESCRIPTION OF THE PREFERRED EMBODIMENTS

Hereinafter, an embodiment of the invention will be described with reference to the drawings.

Figure 1:
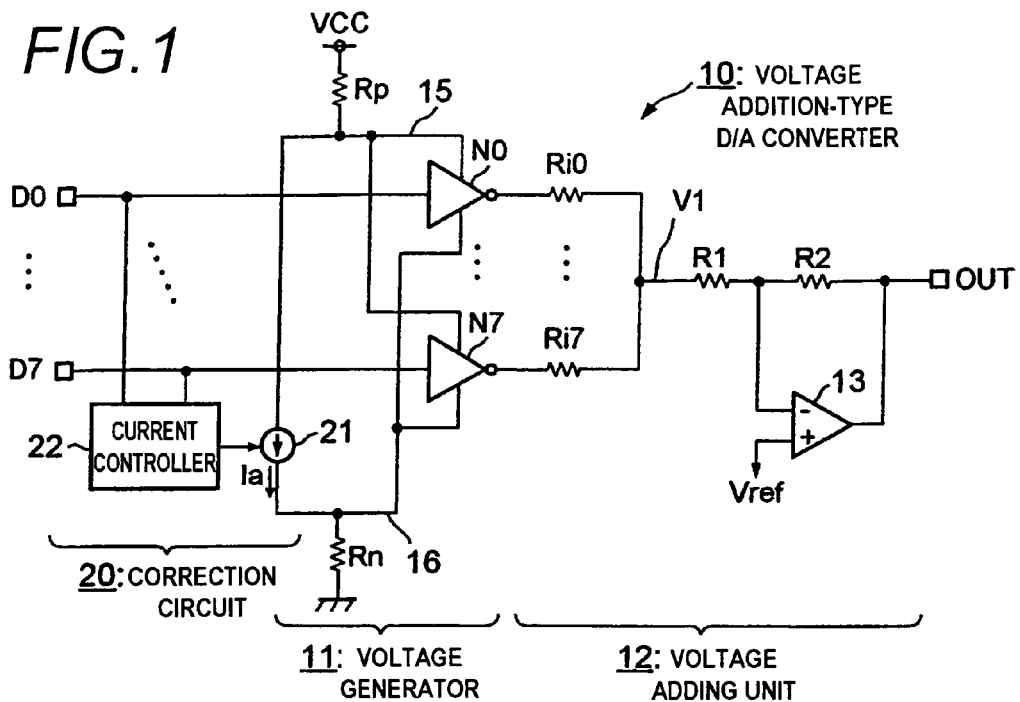
FIG. 1 is a circuit diagram showing the configuration of a correction circuit of a D/A converter according to an embodiment of the invention.
Figure 4:
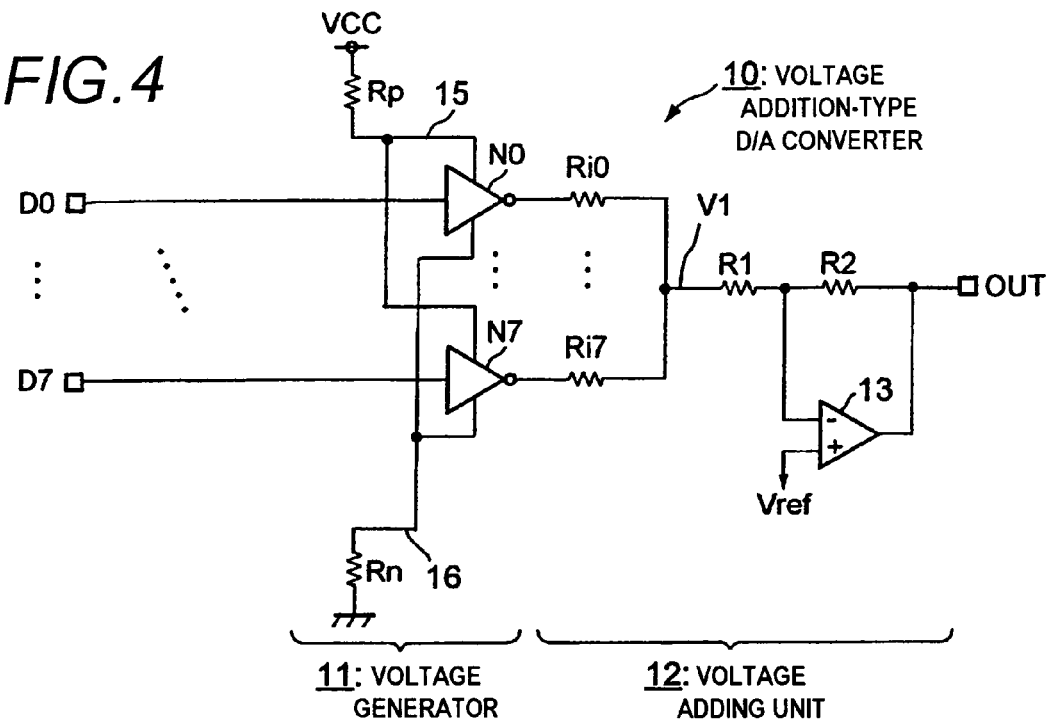
FIG. 4 is a diagram showing a conventional configuration example of a voltage addition-type D/A converter.

FIG. 1 is a circuit diagram showing the configuration of a correction circuit 20 for a D/A converter according to an embodiment of the invention. In the example, the correction circuit 20 which is applied to the above-described voltage addition-type D/A converter 10 of FIG. 4 is shown. In order to facilitate the understanding of the relationship between the correction circuit 20 and the voltage addition-type D/A converter 10, also the voltage addition-type D/A converter 10 is shown together with the correction circuit 20. As shown in FIG. 1, the correction circuit 20 has a constant current source 21 and a current controller 22. The constant current source 21 is connected between the high- and low-potential power source lines 15, 16 for supplying the power source voltage VCC to the voltage addition-type D/A converter 10. The current controller 22 is a circuit which controls a current Ia flowing to the constant current source 21 in accordance with the contents of the bits D0 to D7 of the input digital signal to the voltage addition-type D/A converter 10 so that a variation of the sum of currents which flow to the low-potential power source line 16 from the high-potential power source line 15 through the voltage generator 11 of the D/A converter 10 and the constant current source 21 is reduced (i.e., the sum of currents likely becomes constant) irrespective of the contents of the bits D0 to D7 of the input digital signal.

Specifically, as shown in the table below (Table 2), the current controller 22 controls the current Ia flowing to the constant current source 21, in accordance with the number n of H-level bits among the bits D0 to D7 of the input digital signal, so that the sum of currents which flow to the low-potential power source line 16 from the high-potential power source line 15 through the voltage generator 11 of the D/A converter 10 and the constant current source 21, respectively is always set to VCC/(6R). In Table 2 below, the relationship between n and I is identical with that shown in Table 1.

TABLE 2

| n | I | Ia |
|---|---|---|
| 0 | 0 | VCC/(6R) |
| 1 | (7VCC)/(96R) | VCC/(6R) − (7VCC)/(96R) |
| 2 | VCC/(8R) | VCC/(6R) − VCC/(8R) |
| 3 | (5VCC)/(32R) | VCC/(6R) − (5VCC)/(32R) |
| 4 | VCC/(6R) | 0 |
| 5 | (5VCC)/(32R) | VCC/(6R) − (5VCC)/(32R) |
| 6 | VCC/(8R) | VCC/(6R) − VCC/(8R) |
| 7 | (7VCC)/(96R) | VCC/(6R) − (7VCC)/(96R) |
| 8 | 0 | VCC/(6R) |

Figure 2A:
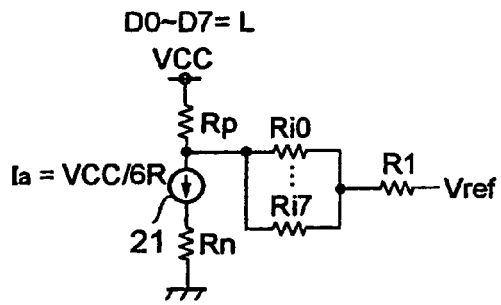
FIGS. 2A to 2C are diagrams illustrating a method of controlling a current flowing to a constant current source in the embodiment.
Figure 2B:
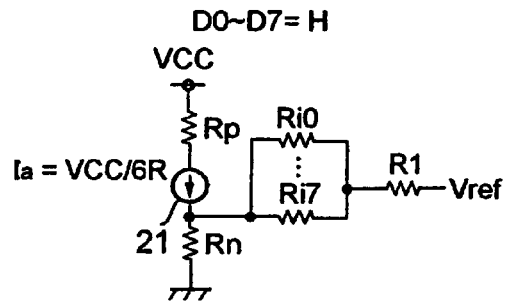
Figure 2C:
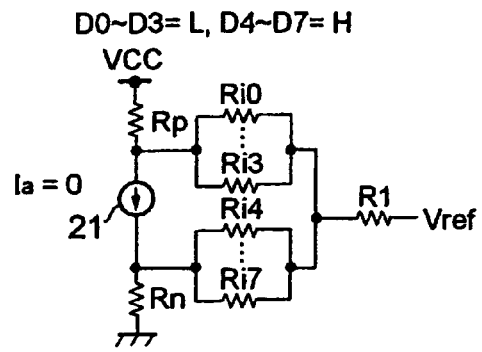

FIGS. 2A to 2C are equivalent circuit diagrams of the input side of the resistor R1 in the case where n=0, 8, and 4 in Table 2 above, and shown in contrast to FIGS. 4A to 4C described above. In the case where all of the bits D0 to D7 are at L level (FIG. 2A) or at H level (FIG. 2B), no current flows through the resistors Ri0 to Ri7, and hence the current Ia=VCC/(6R) is caused to flow through the wiring resistances Rp, Rn by the constant current source 21. By contrast, in the case where four of the bits D0 to D7 are at L level and the other four bits are at H level (FIG. 2C), I=VCC/(6R) flows through the resistors Ri0 to Ri3, and the resistors Ri4 to Ri7. Therefore, the current Ia which flows to the constant current source 21 is set to 0. Also in the case where n has a value other than 0, 8, and 4, the currents are similarly flows. In the embodiment, the current controller 22 determines the current Ia flowing to the constant current source 21 in accordance with Table 2 above, and always sets the sum I+Ia of the currents flowing through the wiring resistances Rp, Rn, to VCC/(6R).

As described above, according to the embodiment, irrespective of the input digital signal to the voltage addition-type D/A converter 10, the current flowing through the wiring resistance Rp of the high-potential power source line 15 and the wiring resistance Rn of the low-potential power source line 16 can be made constant, and the power source voltage supplied to the voltage generator 11 can be made constant. Therefore, degradation of the linearity caused by voltage drops of the wiring resistance Rp of the high-potential power source line 15 and the wiring resistance Rn of the low-potential power source line can be improved.

<Modifications>

Although the embodiment of the invention has been described in the above, various modifications of the embodiment may be possible. For example, there are following modifications.

(1) In the embodiment, the correction circuit 20 that is applied to the D/A converter in which the bits of the input digital signal have the same weight has been described. The invention is applicable also to a D/A converter in which the bits have different weights.

(2) In the embodiment, the invention is applied to a voltage addition-type D/A converter. Alternatively, the invention may be applied to a D/A converter having another configuration such as a current addition-type D/A converter.

Figure 5A:
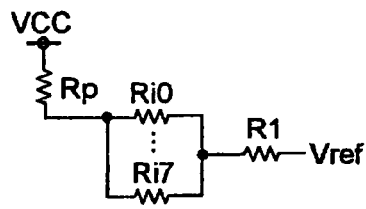
FIGS. 5A to 5C are diagrams illustrating voltage drops caused in high- and low-potential power source lines of the voltage addition-type D/A converter.
Figure 5B:
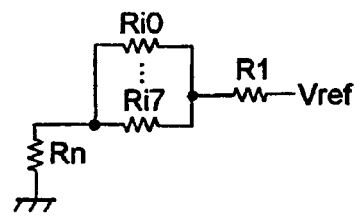
Figure 5C:
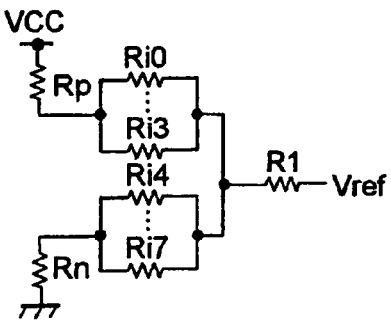

(3) In the embodiment, when the resistances of the resistors Ri0 to Ri7 of the voltage generator 11 are dispersed, this causes the linearity of the voltage addition-type D/A converter 10 to be degraded. As a technique for compensating the dispersion of the resistances to improve the linearity, there is the DEM (Dynamic Element Matching) technique. In the technique, in the case where an input digital signal, for example, having a value of n is given to a voltage addition-type D/A converter, n bits which are to be set to H level are not fixed, but the spatial and time densities of bits which are to be set to H level are proportional to n, and the bits which are to be set to H level are randomly changed. In the invention, a modification in which the above-described embodiment and the DEM technique are combined with each other may be possible. For example, FIG. 5 of JP-2008-236010A discloses a circuit configuration in which a DEM decoder for realizing the DEM technique is placed in front of a voltage addition-type D/A converter. A mode where the correction circuit of the invention is applied to the voltage addition-type D/A converter may be contemplated.

In this mode, the DEM decoder gives an input digital signal of multiple bits to the voltage addition-type D/A converter, and the DEM decoder can know the number of H-level bits in the input digital signal which is given to the voltage addition-type D/A converter. In the case where the correction circuit of the invention is applied to a voltage addition-type D/A converter which is located in rear of such a DEM decoder, the DEM decoder may inform the current controller of the number of H-level bits in the input digital signal, and, in accordance with the information, the current controller may control the current flowing to the constant current source.

Figure 3:
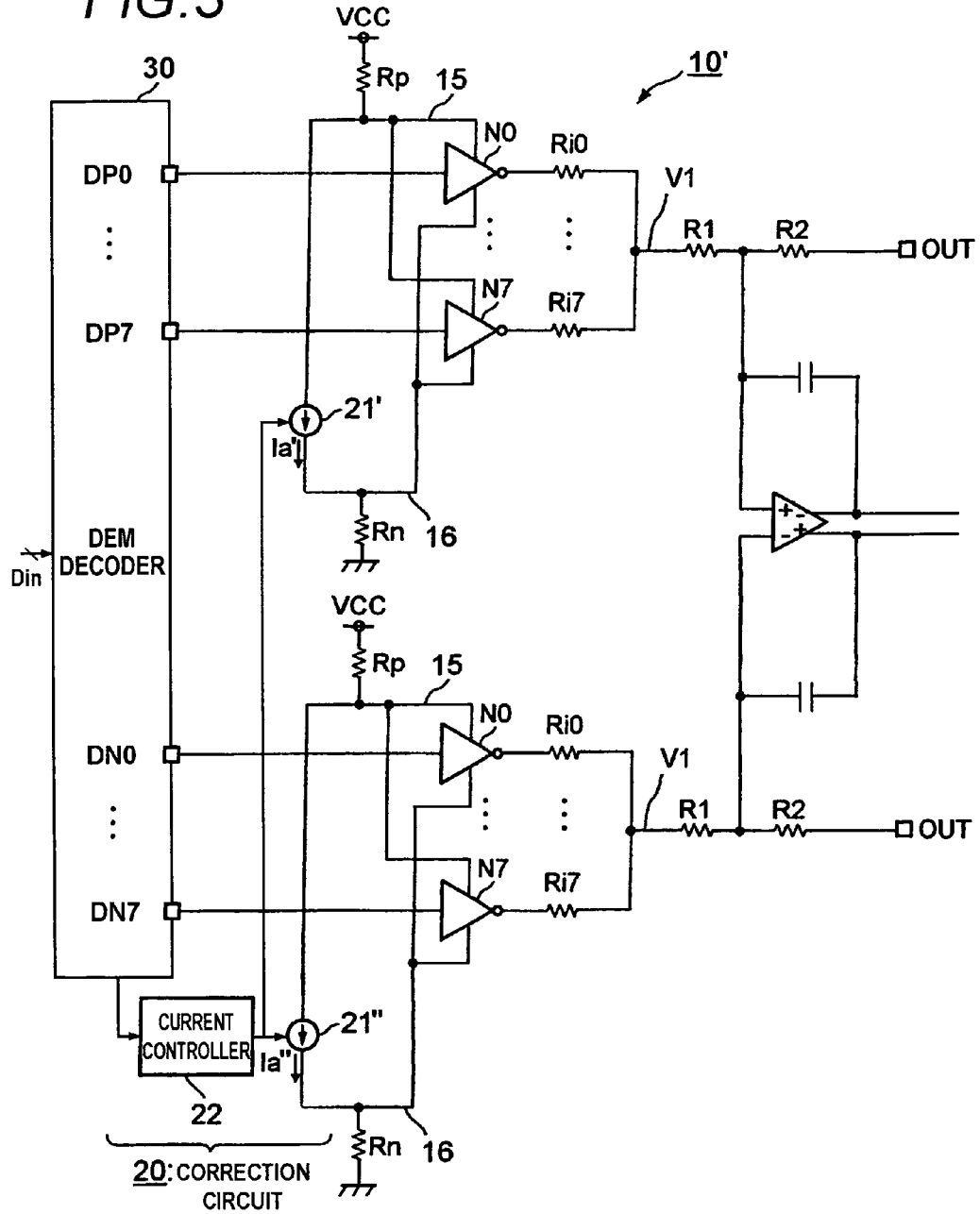
FIG. 3 is a circuit diagram showing the configuration of a correction circuit of a D/A converter and a DEM decoder according to a modification of the embodiment.

In FIG. 3, the configuration of a correction circuit 20 of a D/A converter 10' and a DEM decoder 30 is shown. An input digital signal Din is input to the DEM decoder 30. The DEM decoder 30 gives a plurality of lines of time-series digital signals (DP0 to DP7 and DN0 to DN7), each signal having a density of 1 or 0 (i.e., H-level bit or L-level bit) conforming to an input digital signal to the D/A converter 10'. In this case, the DEM decoder 30 transmits information related to the input digital signal to the current controller 22. Specifically, the DEM decoder 30 inform the current controller 22 of the number of H-level bits (or L-level bits) in the input digital signal.

As received the number of H-level bits (or L-level bits), the current controller 22 sets the current Ia', Ia" flowing to the respective constant current source 21', 21", so as to reduce a variation of sum of currents which flows to the low-potential power source lines 16 from the high-potential power source lines 15 through the D/A converter 10' and the constant current source 21', 21", respectively. According to the configuration, the invention is also applied to the D/A converter including the DEM decoder, whereby the linearity of the D/A converter including the DEM decoder can be improved.

(4) In the embodiment, the current flowing to the constant current source 21 is changed in accordance with the all kinds of current values of currents which can flow to the wiring resistances Rp, Rn through the voltage generator 11, and the sum of currents which flow through the wiring resistances Rp, Rn is made constant. Specifically, in the example shown in Table 1 above, there are five kinds (including zero) of the values of the currents which flow to the wiring resistances Rp, Rn through the voltage generator 11. As shown in Table 2, therefore, also the current flowing to the constant current source 21 is changed in five kinds (including zero) of the current values. However, current values corresponding to the all kinds of current values of currents which flow to the constant current source 21 may not be used, but a part of the current values are selected, and a current value which is most preferable among them may be selected as the current value which flows to the constant current source 21. For example, the constant current source 21 is configured so that the current values Ia corresponding to n=0, 2, and 4 in Table 2 can flow. As the current value flowing to the constant current source 21, the current value Ia corresponding to n=2 may be selected in the case of n=1 (7), and the current value Ia corresponding to n=4 may be selected in the case of n=3 (5). Also in this mode, the variation in the power source voltage between the high- and low-potential power source lines 15, 16 can be reduced to some extent, and the linearity can be improved.

(5) In the embodiment, the current variation depending on the input digital signal is mainly configured by the variation of the current flowing through the voltage generator 11, and hence the current flowing to the constant current source 21 is controlled so that the sum of the current I flowing through the voltage generator 11 and the current Ia flowing through the constant current source 21 is constant. In the case where, in addition to the voltage generator 11, there is a circuit in which the current variation depending on the input digital signal occurs, however, the current Ia flowing to the constant current source 21 may be controlled so that the sum of currents is constant, including such a circuit.

(6) In the above example, although the input digital signal is defined by eight bits (D0-D7), the number of bits are not limited thereto, and more or less of eight bits can be used. In this case the number of inverters and resistances to be provided are set to the same number of the bits.

(7) In the embodiment, the sum of currents (I+Ia) which flows to the low-potential power source line 16 from the high-potential power source line 15 through the voltage generator 11 of the D/A converter 10 and the constant current source 21, respectively is always set to VCC/(6R) that corresponds to a state in which the number n of H-level bits is 4.

However, the sum of currents is not limited thereto, and it is possible that the sum of currents (I+Ia) which flows to the low-potential power source line 16 becomes the same as a current which flows through the D/A converter in a specific number (e.g., 0 to 7 in the embodiment) of high-level bits of the input digital signal. For example, as shown in Table 3, the current controller 22 controls the current Ia so that the sum of currents (I+Ia) may be set to, for example, VCC/(8R) that corresponds to a state in which the number n of H-level bits is 2.

TABLE 3

| n | I | Ia |
|---|---|---|
| 0 | 0 | VCC/(8R) |
| 1 | (7VCC)/(96R) | VCC/(8R) − (7VCC)/(96R) |
| 2 | VCC/(8R) | 0 |
| 3 | (5VCC)/(32R) | VCC/(8R) − (5VCC)/(32R) |
| 4 | VCC/(6R) | VCC/(8R) − VCC/(6R) |
| 5 | (5VCC)/(32R) | VCC/(8R) − (5VCC)/(32R) |
| 6 | VCC/(8R) | 0 |
| 7 | (7VCC)/(96R) | VCC/(8R) − (7VCC)/(96R) |
| 8 | 0 | VCC/(8R) |

Further, it is possible that the current controller 22 controls the current Ia so that the sum of currents (I+Ia) which flows to the low-potential power source line 16 may be set to an arbitrary value, within a range where a design burden or a consumption current value is acceptable.

What is claimed is:

1. A correction circuit for an addition-type D/A converter which includes an addition unit for generating a voltage or a current in correspondence with each of bit values of an input digital signal and adding to one another, the correction circuit comprising:
a constant current source connected in parallel to the D/A converter between high- and low-potential power source lines for supplying a power source voltage to the D/A converter; and
a current controller which is adapted to receive the input digital signal and control a current flowing from the constant current source in accordance with the bit values of the input digital signal to the D/A converter, so as to reduce a variation of a sum of currents which, even when the input digital signal to the D/A converter is varied, flows to the low-potential power source line from the high-potential power source line through the addition unit of the D/A converter and through the constant current source, respectively.

2. The correction circuit according to claim 1, wherein the current controller controls the current flowing from the constant current source so that the sum of currents which flows to the low-potential power source line from the high-potential power source line becomes constant.

3. The correction circuit according to claim 2, wherein the current controller controls the current flowing from the constant current source so that the sum of currents which flows to the low-potential power source line from the high-potential power source line becomes the same as a current which flows through the D/A converter for a specific number of high-level bits of the input digital signal.

4. A combination circuit, comprising:
an addition-type D/A converter which includes:
a generator which is disposed between high- and low-potential power source lines for supplying a power source voltage to the D/A converter, and which generates a voltage or a current in correspondence with each of bit values of an input digital signal; and
an addition unit which adds the generated voltages or currents to one another;
a constant current source connected in parallel to the generator of the D/A converter between the high- and low-potential power source lines; and
a current controller which is adapted to receive the input digital signal and control a current flowing from the constant current source in accordance with the bit values of the input digital signal to the D/A converter, so as to reduce, even when each of the bit values of the input digital signal to the D/A converter is varied, a variation of a sum of a first current which flows in a first path connecting to the low-potential power source line from the high-potential power source line through the generator and the addition unit of the D/A converter and a second current which flows in a second path connecting to the low-potential power source line from the high-potential power source line through the constant current source.

5. The combination circuit according to claim 4, further comprising a DEM decoder provided at an input side of the D/A converter, wherein the DEM decoder controls the current controller so as to reduce a variation of a sum of currents which flows to the low-potential power source line from the high-potential power source line through the D/A converter and through the constant current source, respectively.

6. The combination circuit according to claim 4, wherein the current controller controls the current flowing from the constant current source so that the sum of currents which flows to the low-potential power source line from the high-potential power source line becomes constant.

7. The combination circuit according to claim 6, wherein the current controller controls the current flowing from the constant current source so that the sum of currents which flows to the low-potential power source line from the high-potential power source line becomes the same as a current which flows through the D/A converter for a specific number of high-level bits of the input digital signal.

* * * * *